(12) United States Patent
Cheng et al.

(10) Patent No.: US 9,252,017 B2
(45) Date of Patent: Feb. 2, 2016

(54) STACKED NANOWIRE

(71) Applicant: International Business Machines Corporation, Armonk, NY (US)

(72) Inventors: Kangguo Cheng, Schenectady, NY (US); Bruce B. Doris, Brewster, NY (US); Pouya Hashemi, White Plains, NY (US); Ali Khakifirooz, Mountain View, CA (US); Alexander Reznicek, Troy, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 4 days.

(21) Appl. No.: 14/044,131

(22) Filed: Oct. 2, 2013

(65) Prior Publication Data

US 2015/0060981 A1 Mar. 5, 2015

Related U.S. Application Data

(63) Continuation of application No. 14/017,822, filed on Sep. 4, 2013.

(51) Int. Cl.
| | |
|---|---|
| *H01L 21/28* | (2006.01) |
| *H01L 29/06* | (2006.01) |
| *H01L 29/66* | (2006.01) |
| *H01L 21/02* | (2006.01) |
| *H01L 29/78* | (2006.01) |
| *B82Y 40/00* | (2011.01) |
| *H01L 29/775* | (2006.01) |
| *B82Y 10/00* | (2011.01) |

(52) U.S. Cl.
CPC .............. *H01L 21/28* (2013.01); *B82Y 10/00* (2013.01); *B82Y 40/00* (2013.01); *H01L 21/02603* (2013.01); *H01L 29/0669* (2013.01); *H01L 29/0673* (2013.01); *H01L 29/66439* (2013.01); *H01L 29/66795* (2013.01); *H01L 29/775* (2013.01); *H01L 29/785* (2013.01); *Y10S 977/762* (2013.01)

(58) Field of Classification Search
None
See application file for complete search history.

(56) References Cited

U.S. PATENT DOCUMENTS

| | | | | |
|---|---|---|---|---|
| 6,770,541 | B1 * | 8/2004 | Yin et al. | 438/424 |
| 7,893,492 | B2 | 2/2011 | Bedell et al. | |
| 8,080,468 | B2 | 12/2011 | Scherer et al. | |
| 8,110,471 | B2 | 2/2012 | Lee et al. | |
| 8,263,462 | B2 * | 9/2012 | Hung et al. | 438/286 |
| 8,395,195 | B2 * | 3/2013 | Chang et al. | 257/255 |
| 2008/0135949 | A1 | 6/2008 | Lo et al. | |
| 2010/0163838 | A1 * | 7/2010 | Chu-Kung et al. | 257/9 |

(Continued)

OTHER PUBLICATIONS

Fang et al., "Vertically stacked SiGe nanowire array channel CMOS transistors", IEEE Electron Device Letters, vol. 28, No. 3, 2007, pp. 211-213.

(Continued)

*Primary Examiner* — Pamela E Perkins
(74) *Attorney, Agent, or Firm* — Cantor Colburn LLP

(57) ABSTRACT

A method of fabricating stacked nanowire for a transistor gate and a stacked nanowire device are described. The method includes etching a fin as a vertical structure from a substrate and forming two or more pairs of spacers at vertically separated positions of the fin. The method also includes oxidizing to form the nanowires at the vertically separated positions of the fin.

9 Claims, 18 Drawing Sheets

(56) References Cited

U.S. PATENT DOCUMENTS

| | | | |
|---|---|---|---|
| 2011/0031470 A1* | 2/2011 | Scherer et al. | 257/9 |
| 2012/0138886 A1* | 6/2012 | Kuhn et al. | 257/9 |
| 2012/0181665 A1* | 7/2012 | Kwon | 257/618 |
| 2012/0319178 A1 | 12/2012 | Chang et al. | |
| 2013/0075797 A1 | 3/2013 | Okano | |
| 2013/0316513 A1* | 11/2013 | Basker et al. | 438/400 |
| 2014/0191323 A1* | 7/2014 | Bergendahl et al. | 257/368 |
| 2014/0332861 A1 | 11/2014 | Cheng et al. | |
| 2015/0064891 A1* | 3/2015 | Cheng et al. | 438/585 |
| 2015/0102409 A1* | 4/2015 | Cheng et al. | 257/347 |

OTHER PUBLICATIONS

Hubert et al., "A stacked SONOS technology, up to 4 levels and 6nm crystalline nanowires, with gate-all-around or independent gates (F-Flash), suitable for full 3D integration," 2009 IEEE International Electron Devices Meeting (IEDM), 2009, pp. 1-4.

Najmzadeh et al., "Silicon nanowires with lateral uniaxial tensile stress profiles for high electron mobility gate-all-around MOSFETs," Microelectronic Engineering, vol. 87, No. 5, 2010, pp. 1561-1565.

Ng et al., "Vertically stacked silicon nanowire transistors fabricated by inductive plasma etching and stress-limited oxidation", IEEE Electron Device Letters, vol. 30, No. 5, 2009, pp. 520-522.

* cited by examiner

US 9,252,017 B2

STACKED NANOWIRE

CROSS-REFERENCE TO RELATED APPLICATION

This application is a continuation of U.S. application Ser. No. 14/017,822 filed Sep. 4, 2013, the disclosure of which is incorporated by reference herein in its entirety.

BACKGROUND

The present invention relates to stacked nanowire, and more specifically, to vertically stacked nanowires formed from single-material fins. Stacked nanowires facilitate higher density arrangements of transistors and, thus, increased scalability of integrated circuits.

SUMMARY

According to one embodiment of the present invention, a method of fabricating stacked nanowire for a transistor gate includes etching a fin as a vertical structure from a substrate; forming two or more pairs of spacers at vertically separated positions of the fin; and oxidizing to form the nanowires at the vertically separated positions of the fin.

According to another embodiment of the present invention, a stacked nanowire device includes a fin etched from a substrate and formed on the substrate, the fin forming a vertical structure extending above the substrate, the fin including a first nanowire at a first location of the fin and a second nanowire at a second location of the fin at respective first vertical positions and oxidized portions formed at respective second vertical positions different from the first vertical positions; and at least two pairs of spacers, a first pair of spacers of the at least two pairs of spacers being arranged on opposite sides of the fin at the first location of the vertical structure of the fin and a second pair of the at least two pairs of spacers being arranged on the opposite sides of the fin at the second location of the vertical structure of the fin.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE SEVERAL VIEWS OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

DETAILED DESCRIPTION

As noted above, stacked nanowires facilitate increased chip density. Previous methods of fabricating stacked nanowires have involved etching layers formed of multiple materials (e.g., etching fins from a stack of Si and SiGe layers). However, because etch rates differ for the different materials making up the fins that are used to form the nanowires, the etching results in a difference in width of the fins at the different layers. Embodiments of the nanowires and methods of forming the nanowires described herein involve fins comprised of a single material and nanowires formed through oxidation of vertical sections of the fins.

Figure 1:
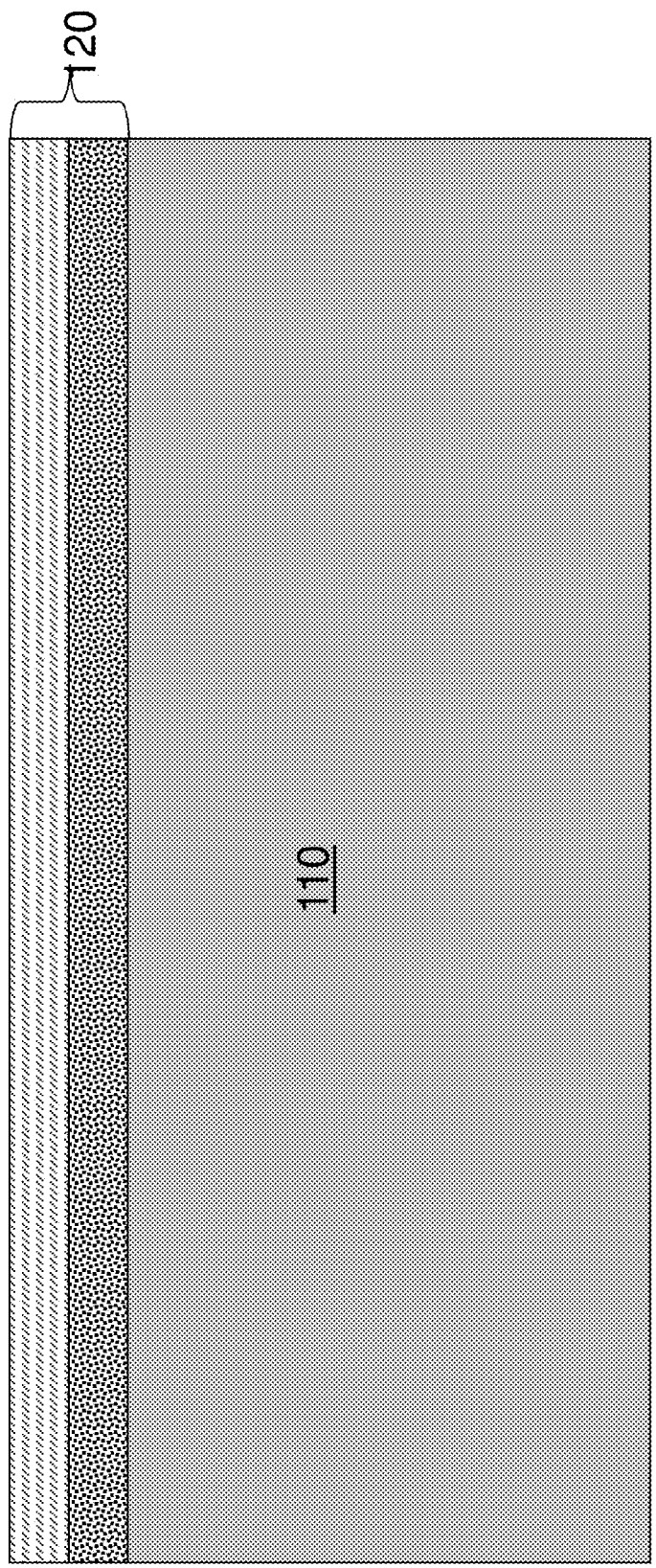
FIG. 1 illustrates a perspective side view of a hardmask deposited on a substrate.

FIG. 1 illustrates a perspective side view of a hardmask 120 deposited on a substrate 110. In exemplary embodiments, the substrate 110 includes silicon (Si), and the hardmask 120 includes silicon nitride and silicon dioxide. The substrate material is ultimately formed into nanowires 101 (see e.g., FIG. 17), as detailed below.

Figure 2:
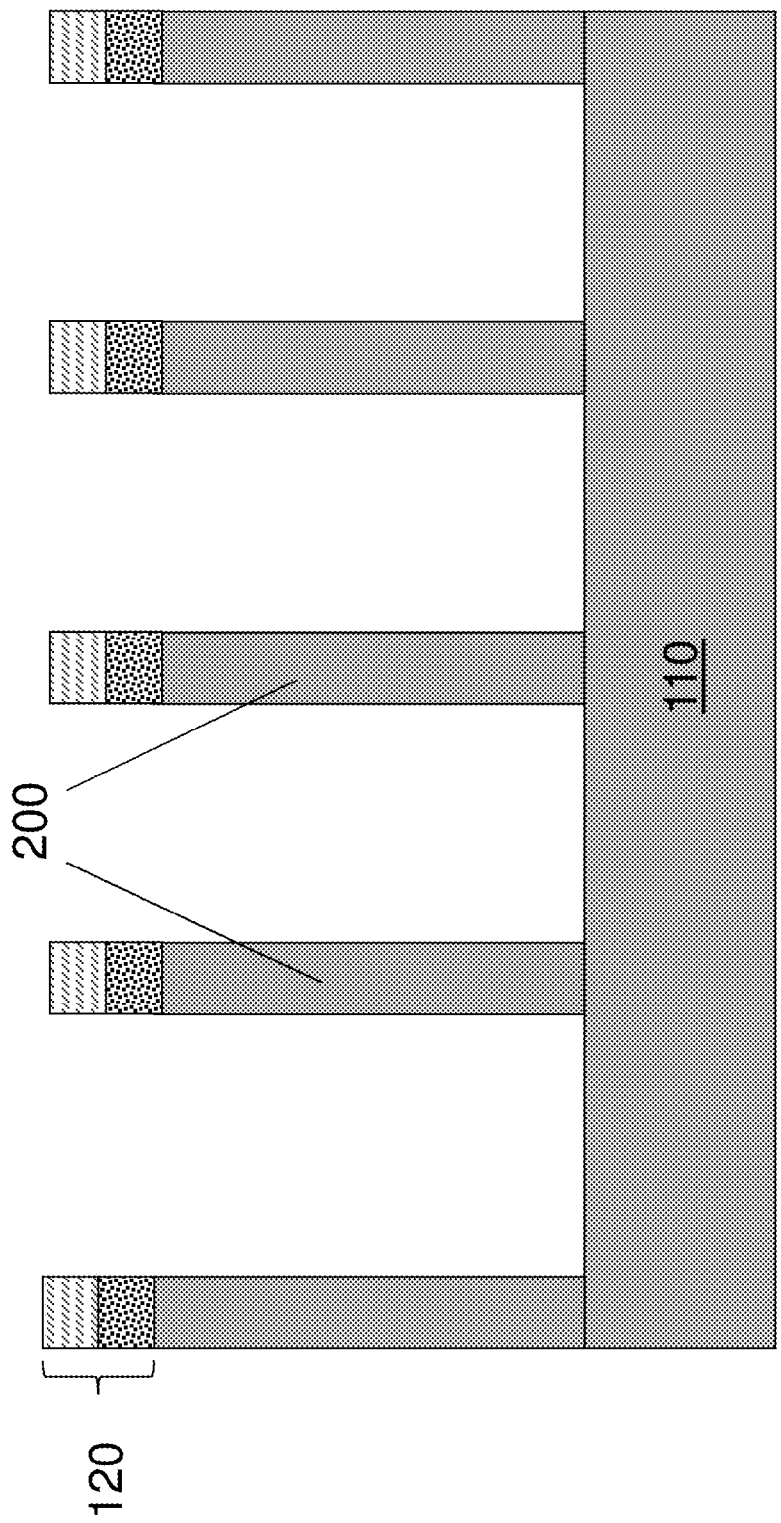
FIG. 2 illustrates a perspective side view showing the fins formed from the substrate.

FIG. 2 illustrates a perspective side view showing the fins 200 formed from the substrate 110. The fins 200 are vertically formed sections of the substrate material. Each single-material vertical section forming a fin 200 is subsequently used to fabricate a vertical stack of nanowires 800 (see e.g., FIGS. 8, 15). As shown in FIG. 2, a portion of the substrate 110 is etched to define the fins 200, and the hardmask 120 above the fins 200 is retained. The etching may be done through lithography and reactive ion etching (RIE).

Figure 3:
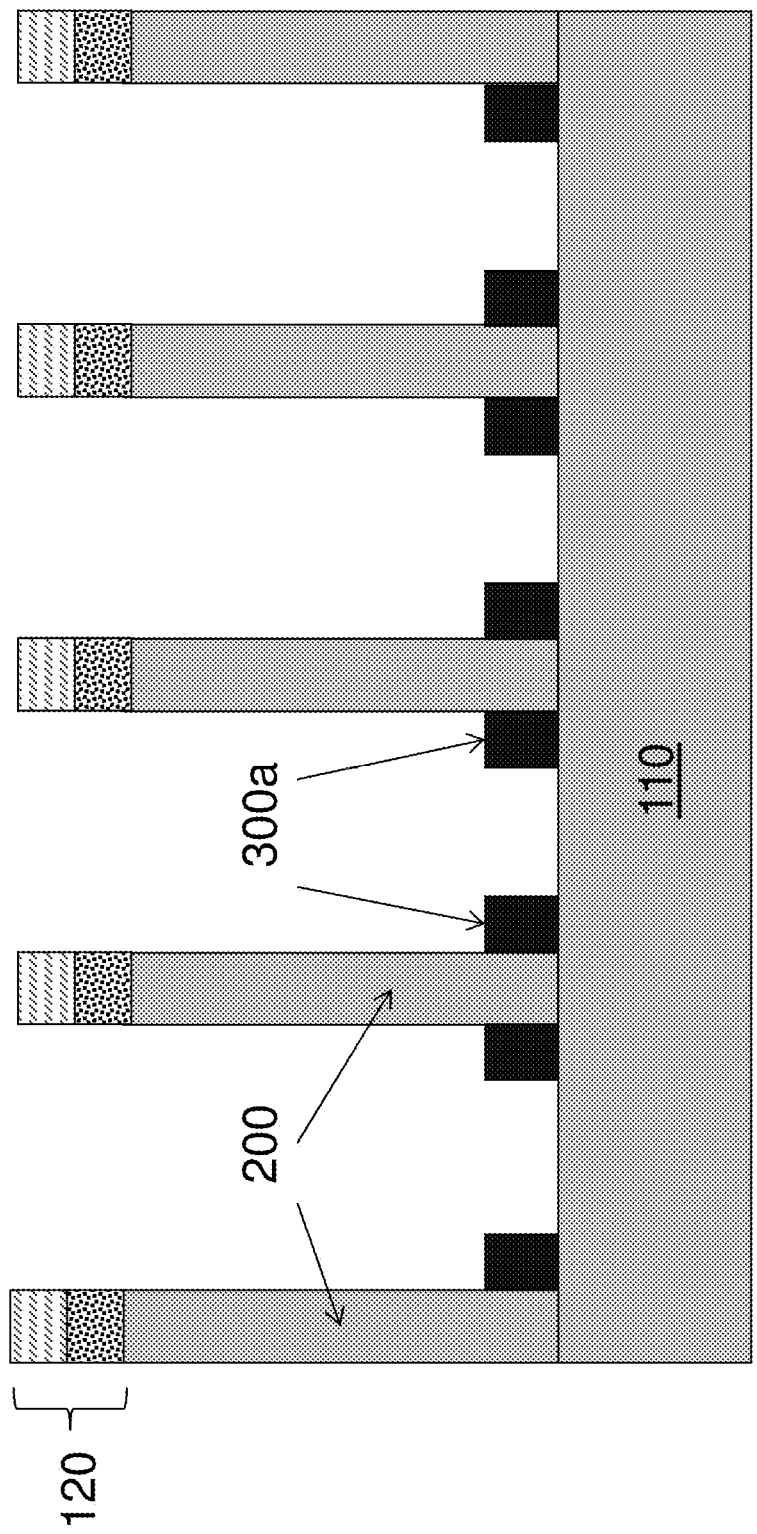
FIG. 3 shows a set of spacers formed on the substrate.
Figure 4:
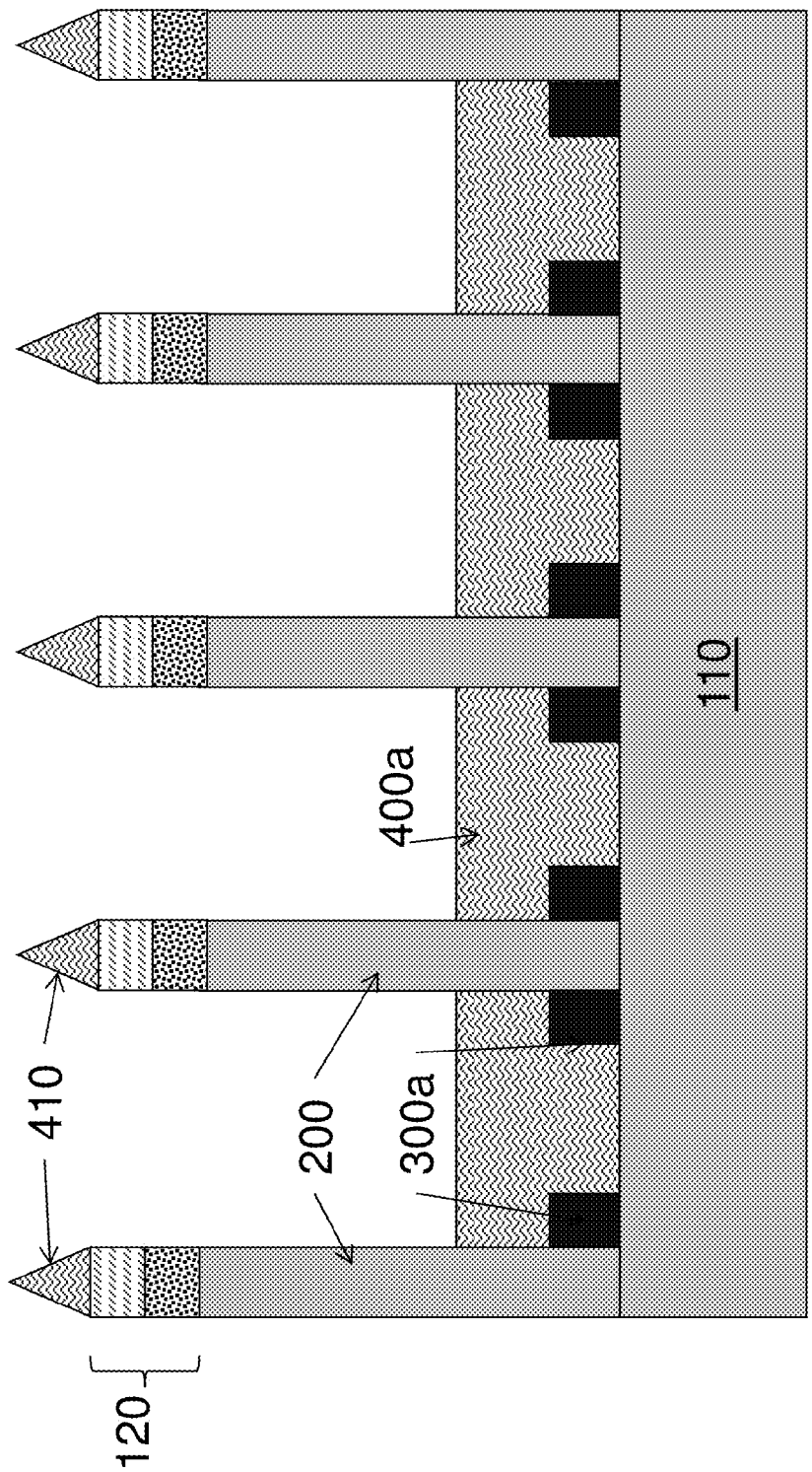
FIG. 4 shows a dielectric film formed on the substrate and the set of spacers.

FIGS. 3-7 illustrate a perspective side view showing formation of sets of spacers 300. FIG. 3 shows a first set of spacers 300a formed on the substrate 110. In the cross-sectional perspective side view of FIG. 3, the spacers 300a are formed on both sides of the fins 200 that are formed above the substrate 110 (a pair of spacers 300a is arranged on opposite sides of each fin 200) though one of the spacers 300a of the pair is not shown on the ends in the figures. The spacers 300a may be formed by depositing a conformal silicon nitride film and performing directional RIE with sufficient over-etch to pull down each spacer 300a to the desired height. FIG. 4 shows a first dielectric film 400a formed on the substrate 110 and the first set of spacers 300a. A high density plasma (HDP) oxide film or other oxide film may be deposited on the substrate 110 and the set of spacers 300a. The oxide film may then be planarized by using, for example, chemical mechanical planarization (CMP) and etched back to form the first dielectric film 400a. A hat structure 410 above the hard mask 120 may also be formed due to the HDP or other oxide film.

Figure 5:
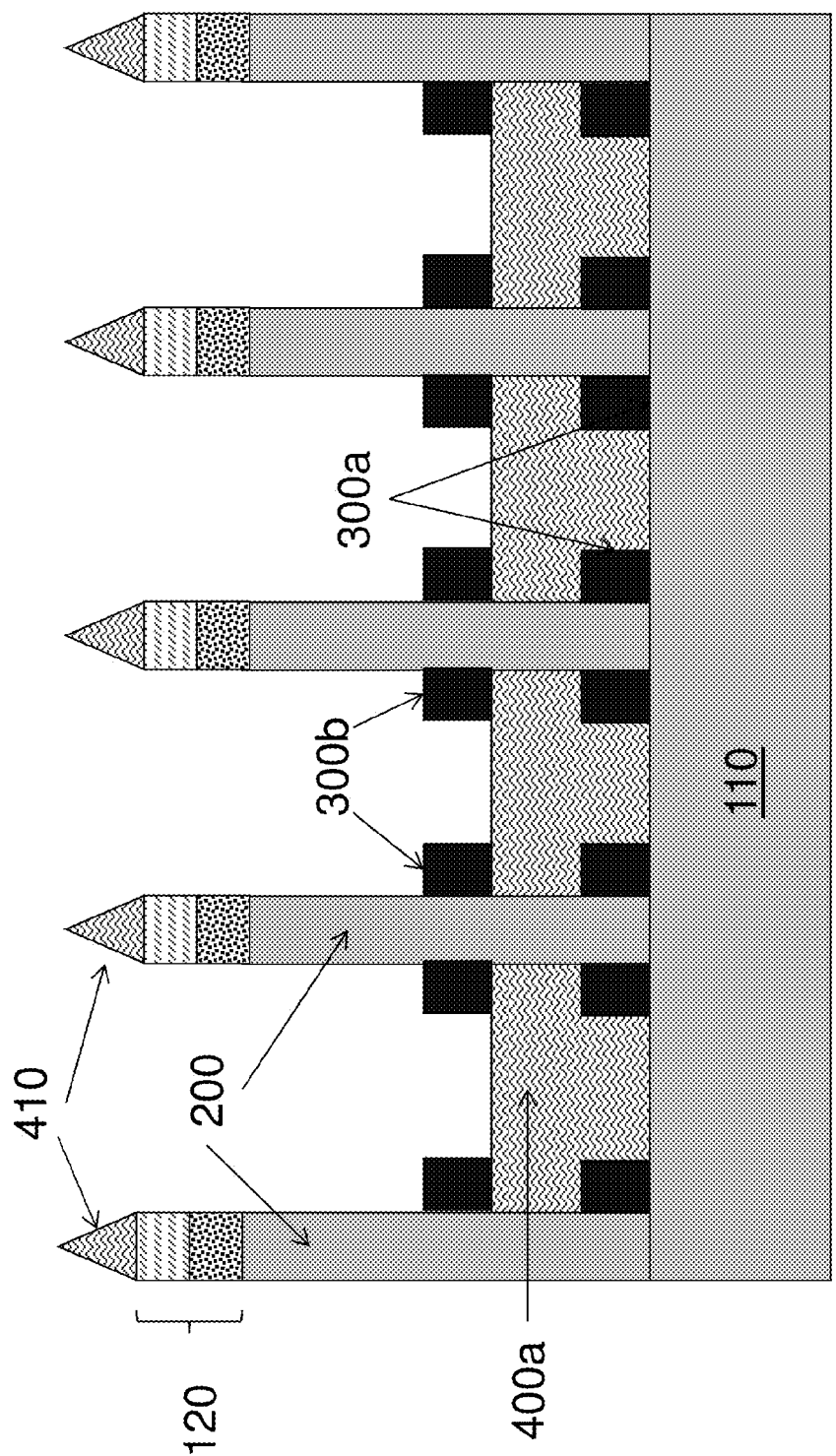
FIG. 5 shows a set of spacers formed above the dielectric film formed on the substrate.

FIG. 5 shows a second set of spacers 300b formed above the dielectric film 400a formed on the substrate 110. The second set of spacers 300b may be formed in a similar manner with respect to the formation of the first set of spacers 300a. That is, conformal silicon nitride film may be deposited and directional RIE may be performed with sufficient over-etch to form the spacers 300b to the desired height. Because the dielectric film 400a is formed over the first set of spacers 300a before the next (second) set of spacers 300b is formed on the dielectric film 400a, the first set of spacers 300a formed on the substrate 110 and the second set of spacers 300b formed on the first dielectric film 400a are vertically separated (by a height corresponding with a height of the first dielectric film 400a). Each of the second set of spacers 300b formed on the first dielectric film 400a is formed above a corresponding one of the first set of spacers 300a formed on the substrate 110 such that the second set of spacers 300b formed on the first dielectric film 400a has the same orientation with respect to the fins 200 (at different heights or vertical positions of the fins 200) as the first set of spacers 300a formed on the substrate 110.

Figure 6:
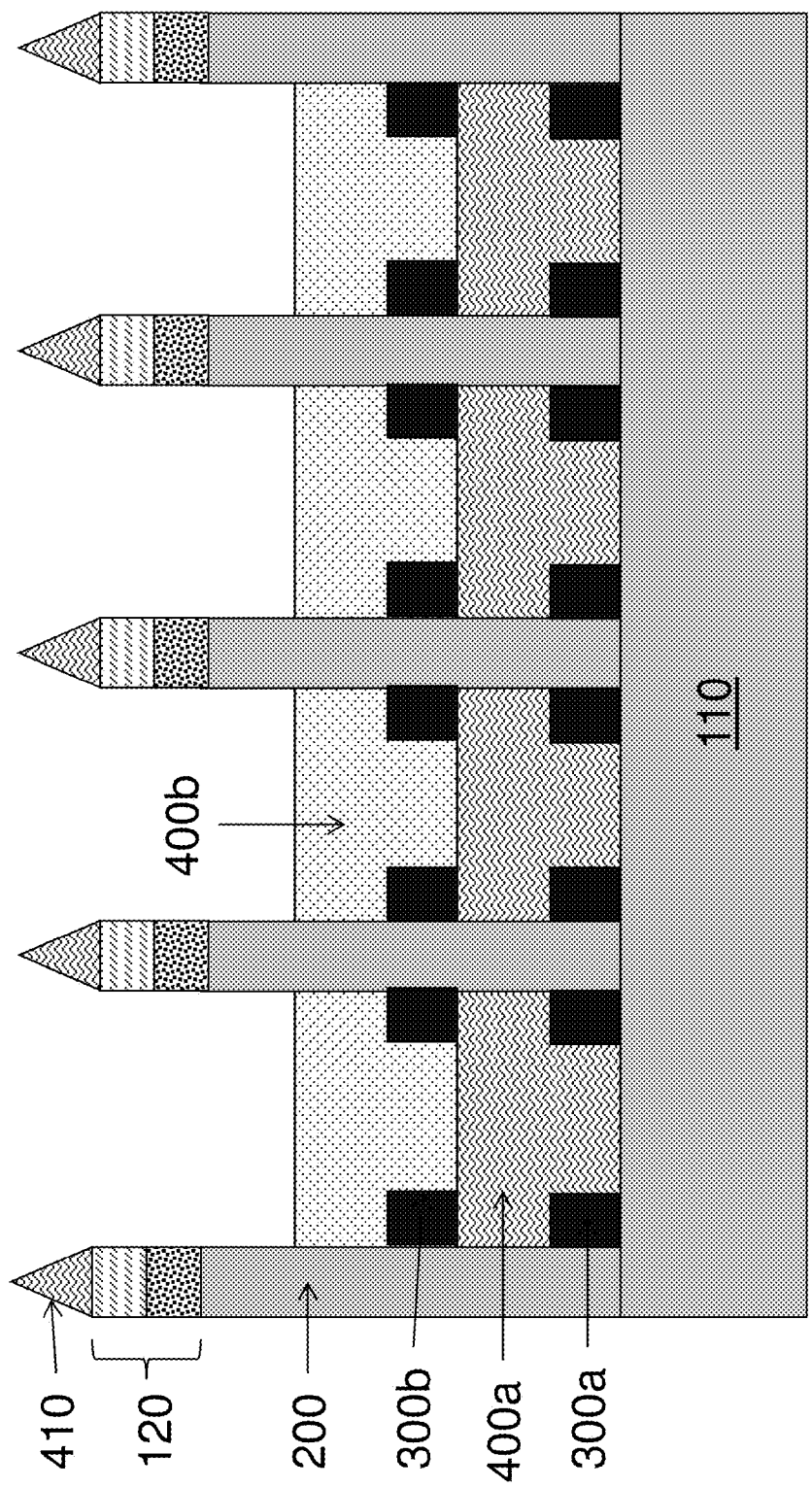
FIG. 6 shows a dielectric film formed on the previously formed dielectric film.
Figure 7:
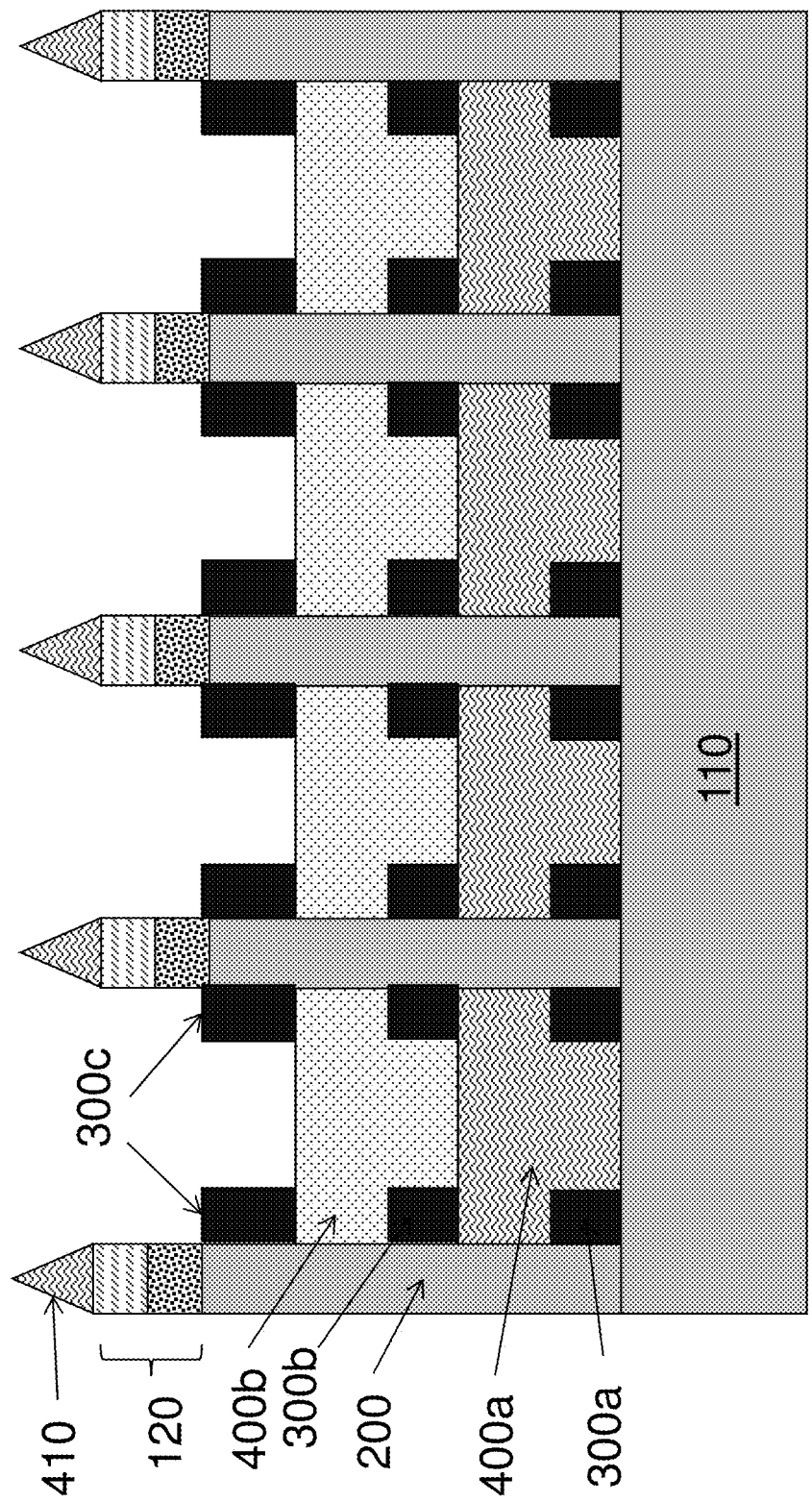
FIG. 7 shows a set of spacers formed above the dielectric film formed over the previously formed dielectric film.

FIG. 6 shows a second dielectric film 400b formed on the previously formed first dielectric film 400a. The second dielectric film 400b is also formed on the set of spacers 300b. Like the first dielectric film 400a formed over the substrate 110, the second dielectric film 400b formed over the previously formed first dielectric film 400a is a discontinuous layer due to the fins 200. The second dielectric film 400b formed over the previously formed first dielectric film 400a may be formed similarly to the previously formed first dielectric film 400a, which was formed over the substrate 110. That is, HDP oxide film or other oxide film may be deposited and planarized by using CMP, for example, and etched back. FIG. 7 shows a third set of spacers 300c formed above the second dielectric film 400b. The third set of spacers 300c may be formed in a similar way as the previously formed first and second sets of spacers 300a, 300b. That is, conformal silicon nitride film may be deposited on the dielectric film 400b and directional RIE may be performed with sufficient over-etch to form the spacers 300c to the desired height. The third set of spacers 300c is vertically separated from the other sets of spacers 300a, 300b due to the dielectric films 400a, 400b. As noted with regard to spacers 300a, 300b, the third set of spacers 300c formed on the dielectric film 400b has the same orientation with respect to the fins 200 (at different vertical positions of the fins 200) as the previously formed sets of spacers 300a, 300b. Although FIGS. 3-7 illustrate the formation of three sets of spacers 300a, 300b, 300c, the sequence of forming spacers 300 and separating each of the sets of spacers 300 with dielectric film 400 may be repeated any number of times to achieve the desired number of stacked nanowires 800 (FIG. 8) at the end of the process.

Figure 8:
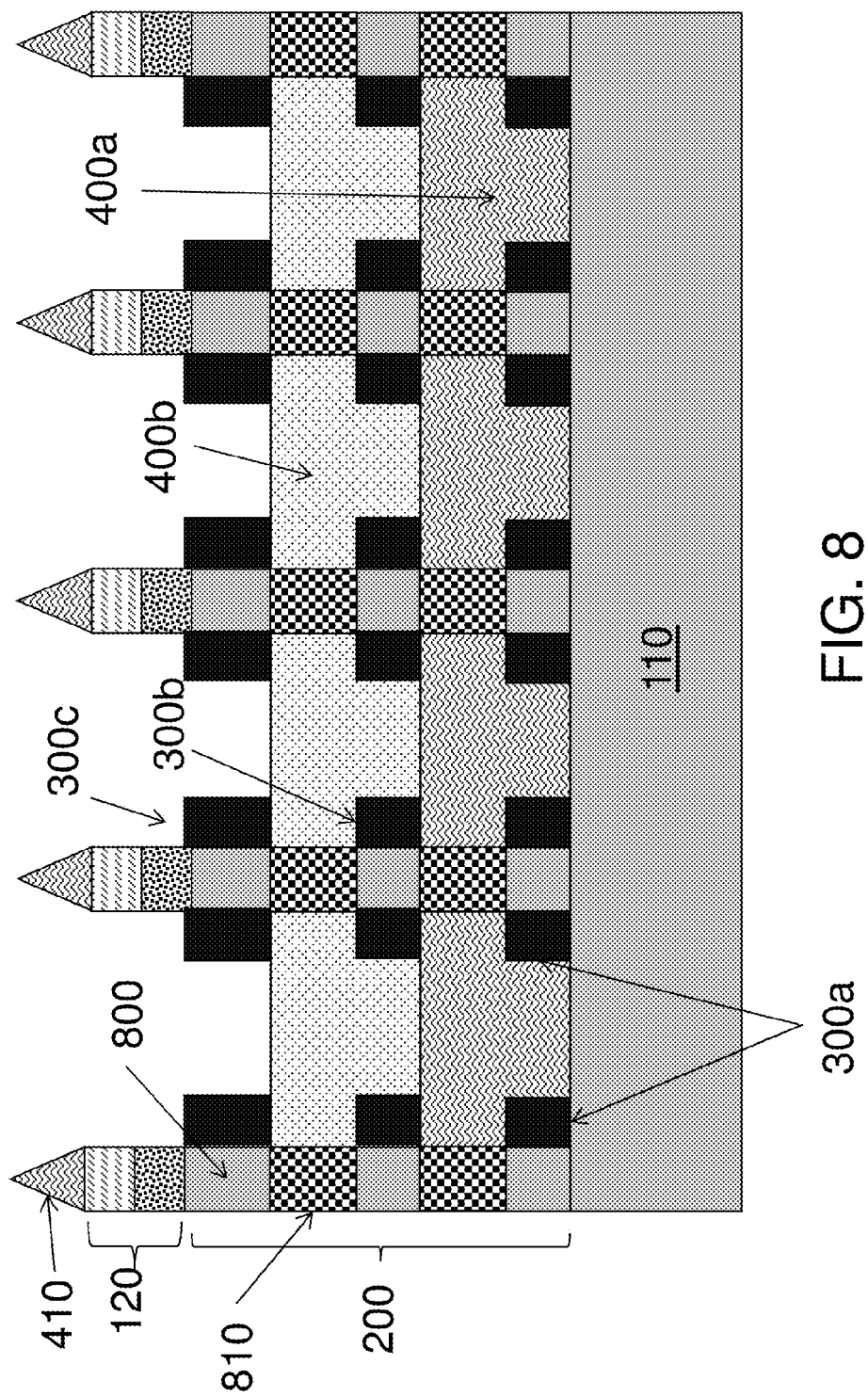
FIG. 8 shows the result of oxidizing the structure shown in FIG. 7.
Figure 9:
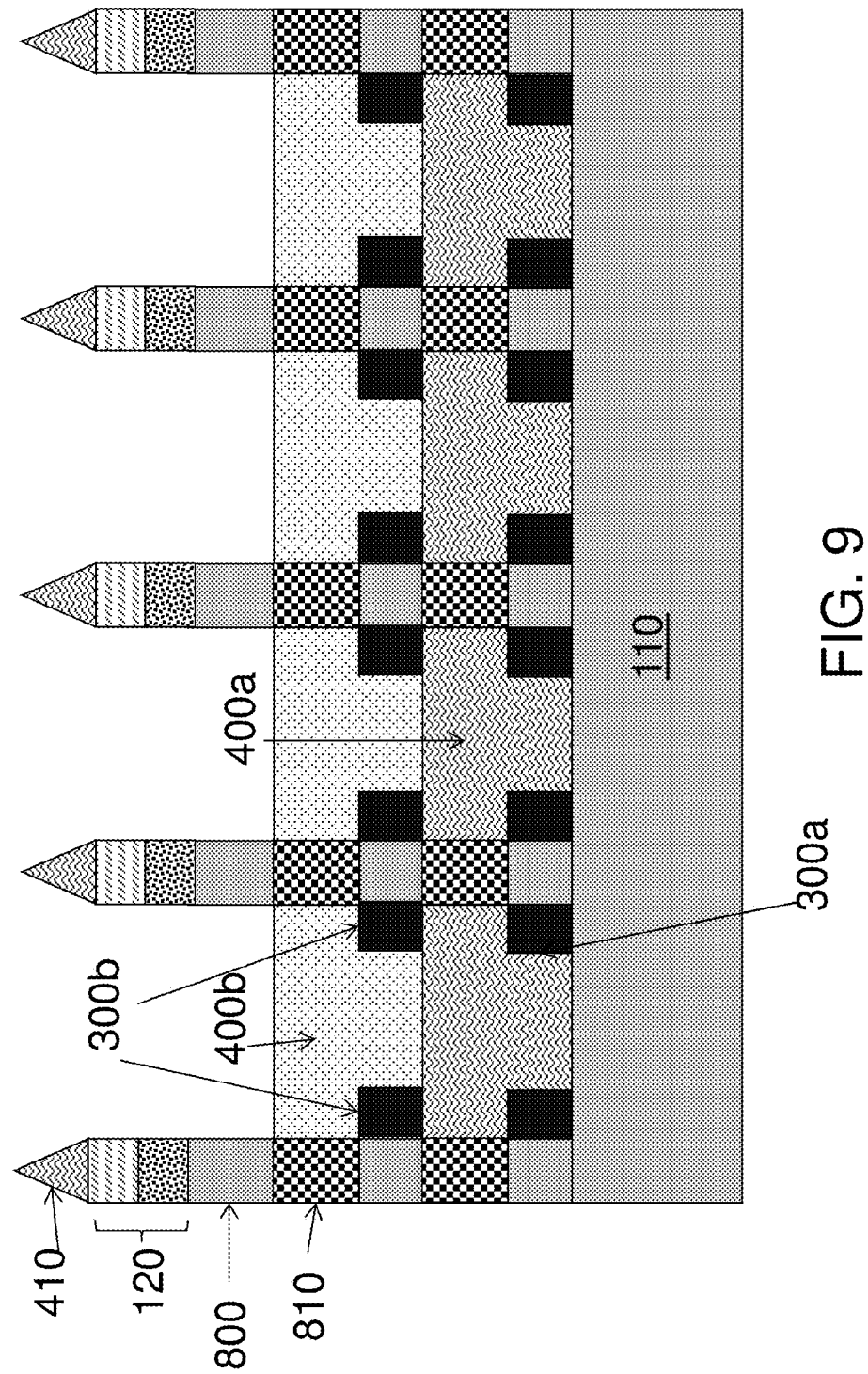
FIG. 9 shows the result of etching the set of spacers from the structure shown in FIG. 8.
Figure 10:
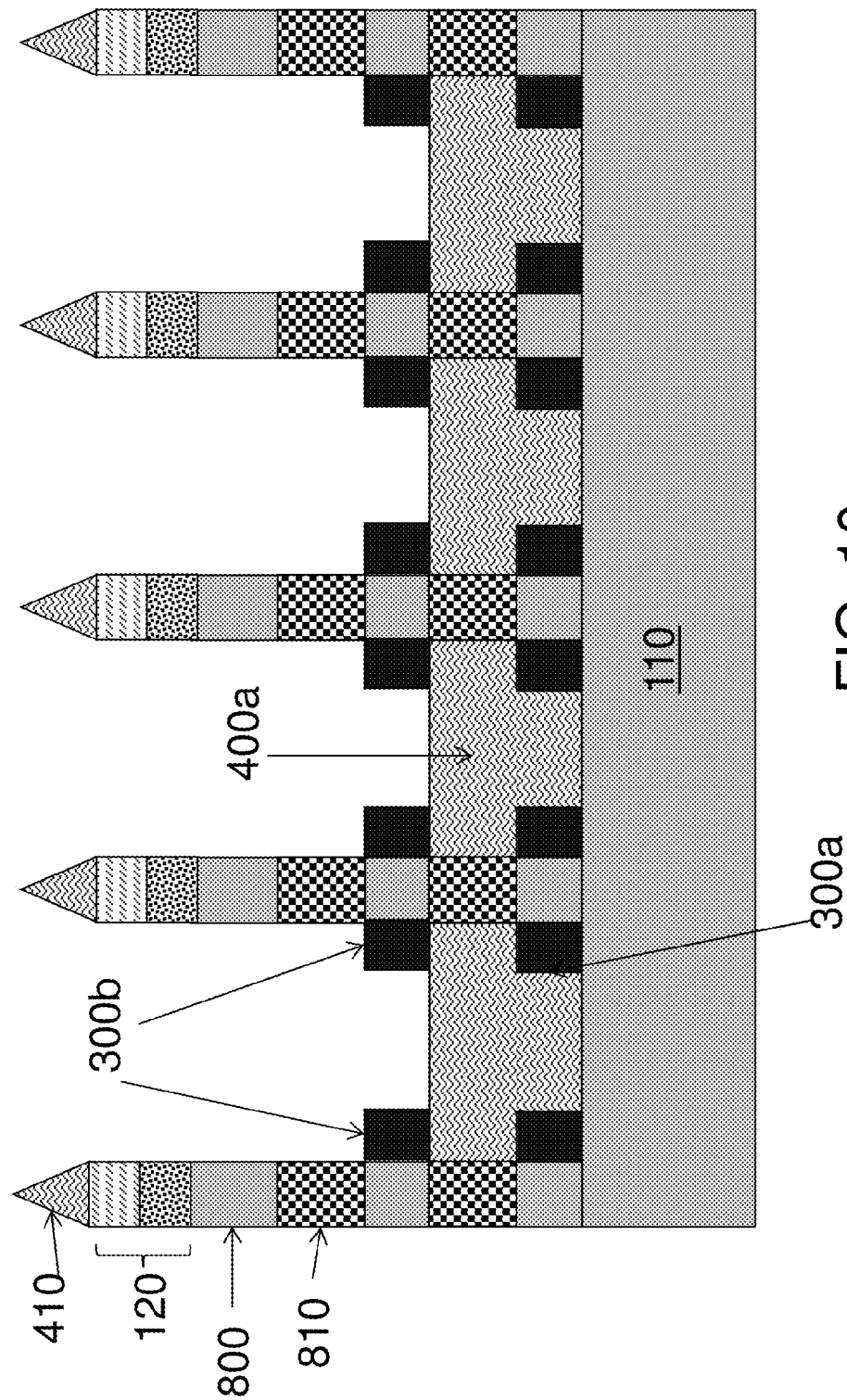
FIG. 10 shows the result of etching the dielectric film from the structure shown in FIG. 9.
Figure 11:
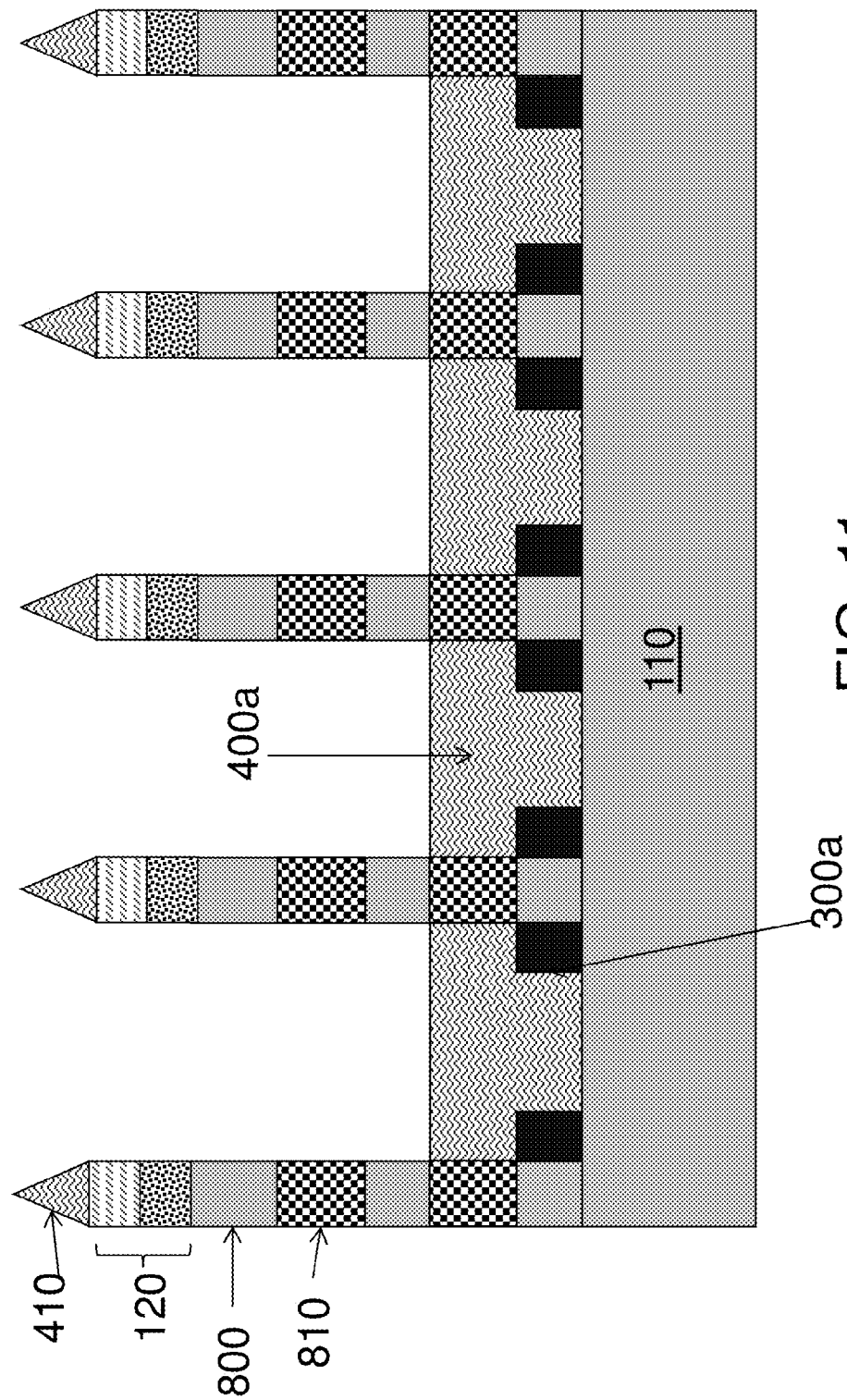
FIG. 11 shows the result of etching the set of spacers from the structure shown in FIG. 10.
Figure 12:
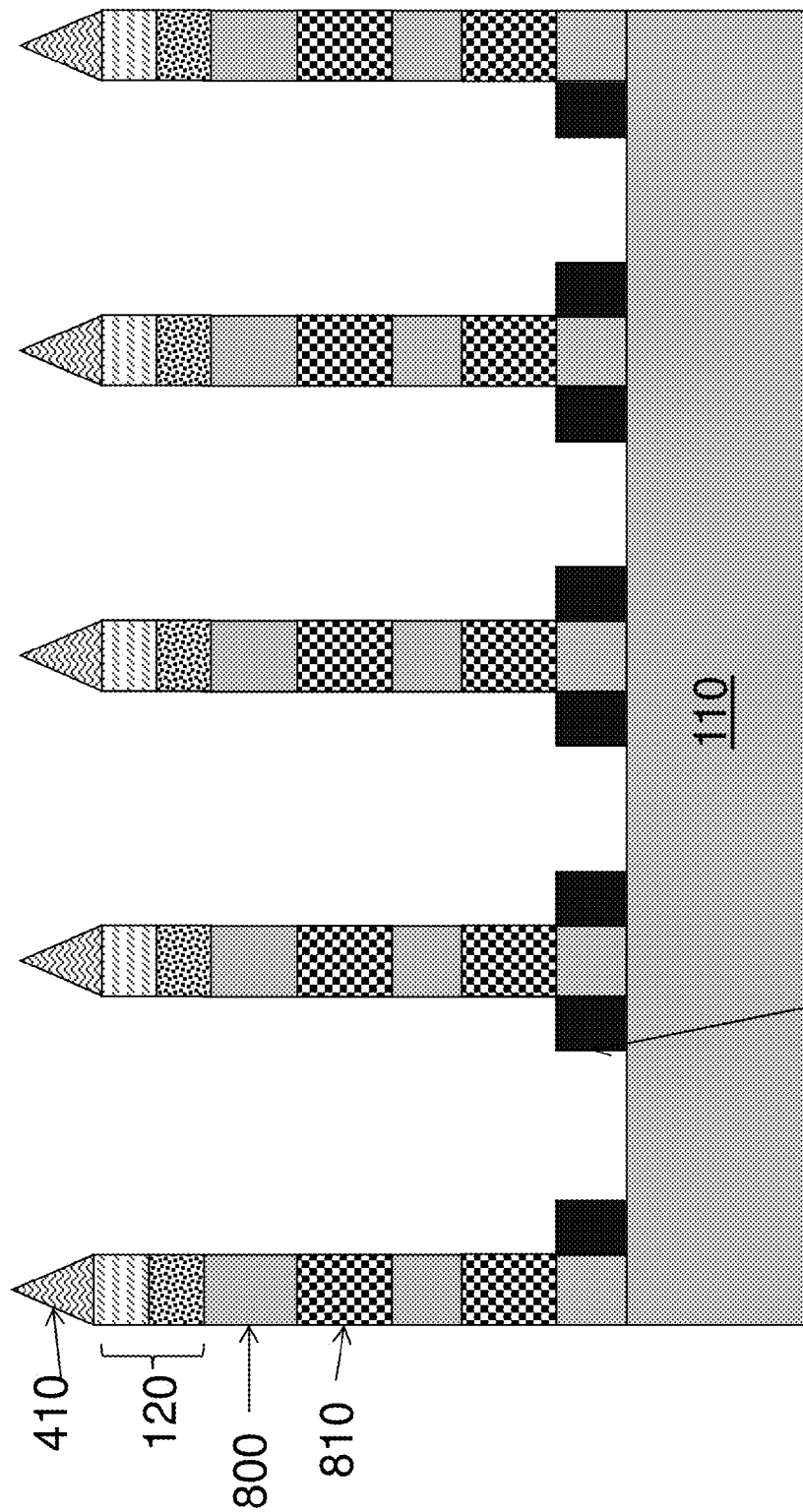
FIG. 12 shows the result of etching the dielectric film from the structure shown in FIG. 11.
Figure 13:
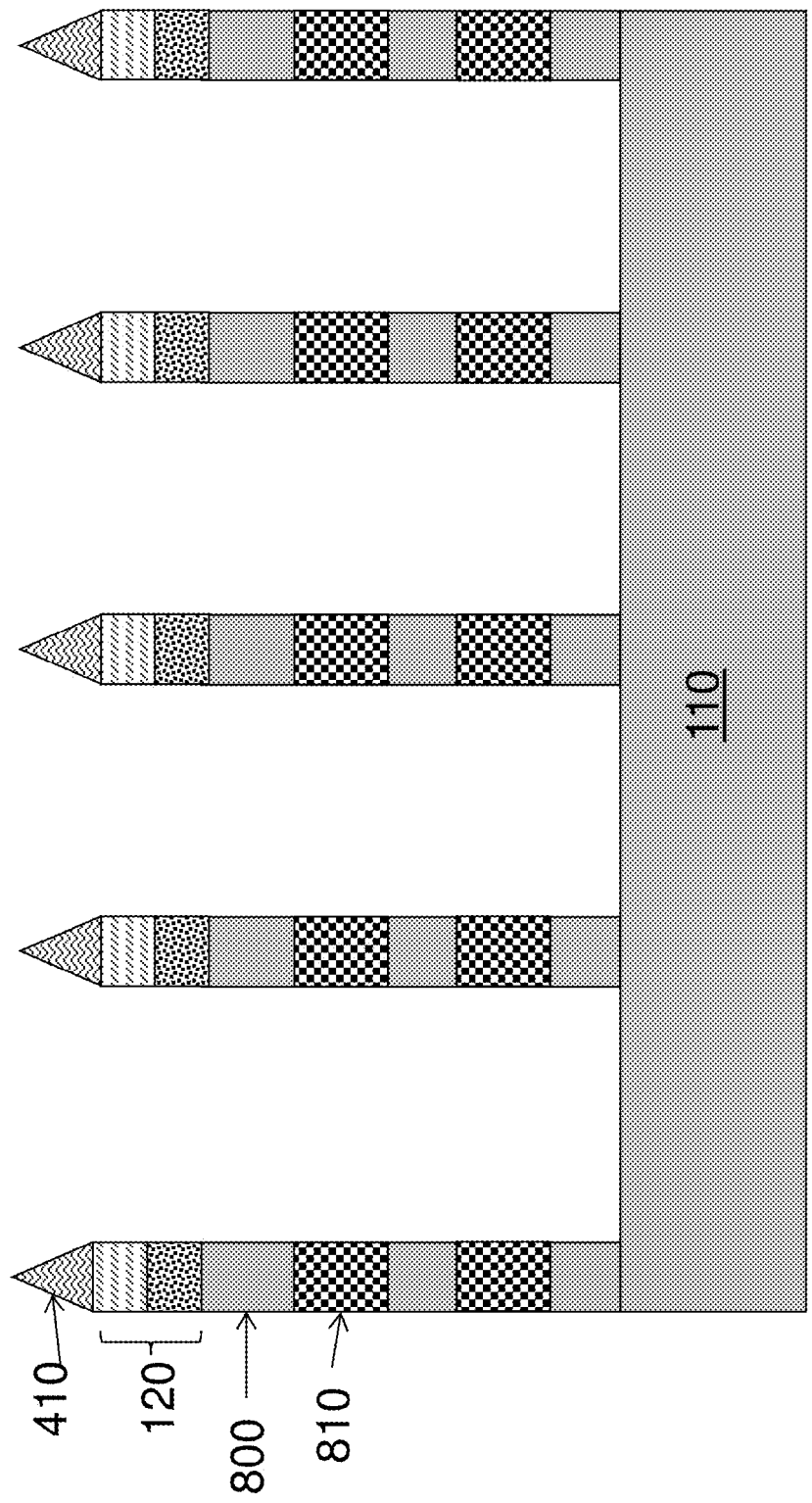
FIG. 13 shows the result of etching the spacers from the structure shown in FIG. 12.

FIGS. 8-13 illustrate steps in the formation of the nanowires 800 according to one embodiment. FIG. 8 shows the result of oxidizing the structure shown in FIG. 7. Oxidation is performed by annealing the structure in an oxygen-containing environment at a temperature typically ranging from 800 degrees Celsius to 1200 degrees Celsius, for example. During the annealing step, oxygen will diffuse through the oxide layers (dielectric films 400b and 400a) and reacts with the fins 200. The sections (nanowires 800) of the fins 200 that are shielded by the spacers 300a, 300b, 300c are unaffected by the oxidation, but the other (unshielded) sections 810 of the fins 200 are oxidized. The sections of the fins 200 that form the nanowires 800 are processed according to the operations illustrated in FIGS. 9 through 13. Because three sets of spacers 300a, 300b, 300c are shown for the current embodiment, three sections (nanowires 800) of each of the fins 200 are shielded from the oxidation, as shown in FIG. 8. Each of the sets of spacers 300c, 300b, 300a and dielectric films 400b, 400a is sequentially etched using RIE, for example. FIG. 9 shows the result of etching the third set of spacers 300c from the structure shown in FIG. 8. This leaves two remaining sets of spacers 300b, 300a. FIG. 10 shows the result of etching the second dielectric film 400b from the structure shown in FIG. 9. This leaves the first dielectric film 400a formed on the substrate 110. FIG. 11 shows the result of etching the second set of spacers 300b from the structure shown in FIG. 10. Only the first set of spacers 300a and the first dielectric film 400a formed on the substrate 110 remain. FIG. 12 shows the result of etching the first dielectric film 400a from the structure shown in FIG. 11. FIG. 13 shows the result of etching the spacers 300a from the structure shown in FIG. 12. The structure shown in FIG. 13 includes the nanowires 800 sections. In the embodiment illustrated by FIGS. 8 through 13, the oxidation precedes the sequential etching of the dielectric films 400a, 400b. Because the dielectric films 400a, 400b are present during the oxidation, the dielectric films 400a, 400b support the fins 200 (including sections of nanowires 800 and oxidized sections 810) and prevent any tilting of the fins 200 during oxidation. The tilting may result from the fact that the sections 810 of the fins 200 that are oxidized experience an expansion in volume (e.g., as Si is converted to $SiO_2$) while the nanowire 800 sections of the fins 200 that are not oxidized do not expand.

Figure 14:
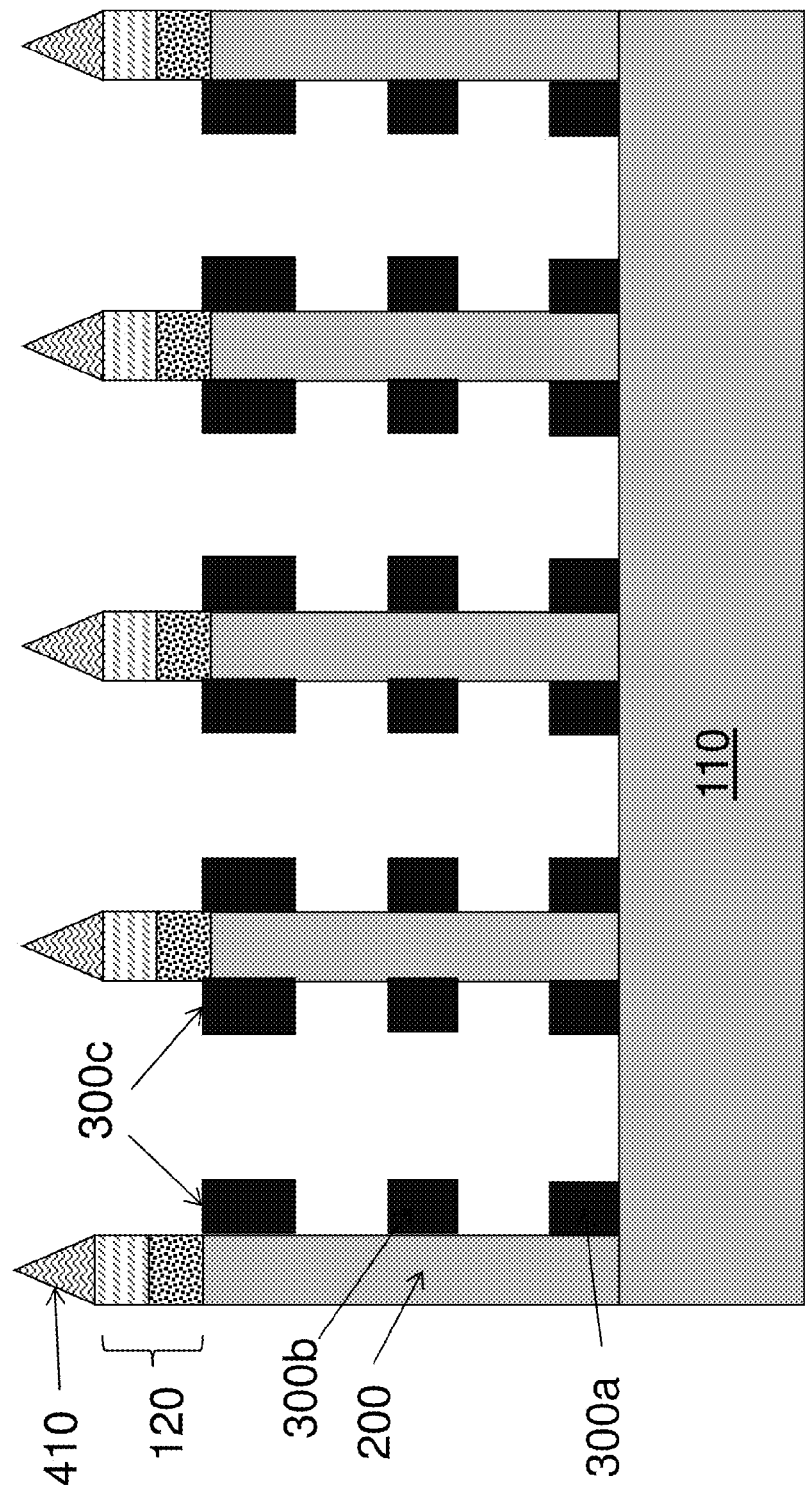
FIG. 14 shows the structure shown in FIG. 7 with the dielectric films removed.
Figure 15:
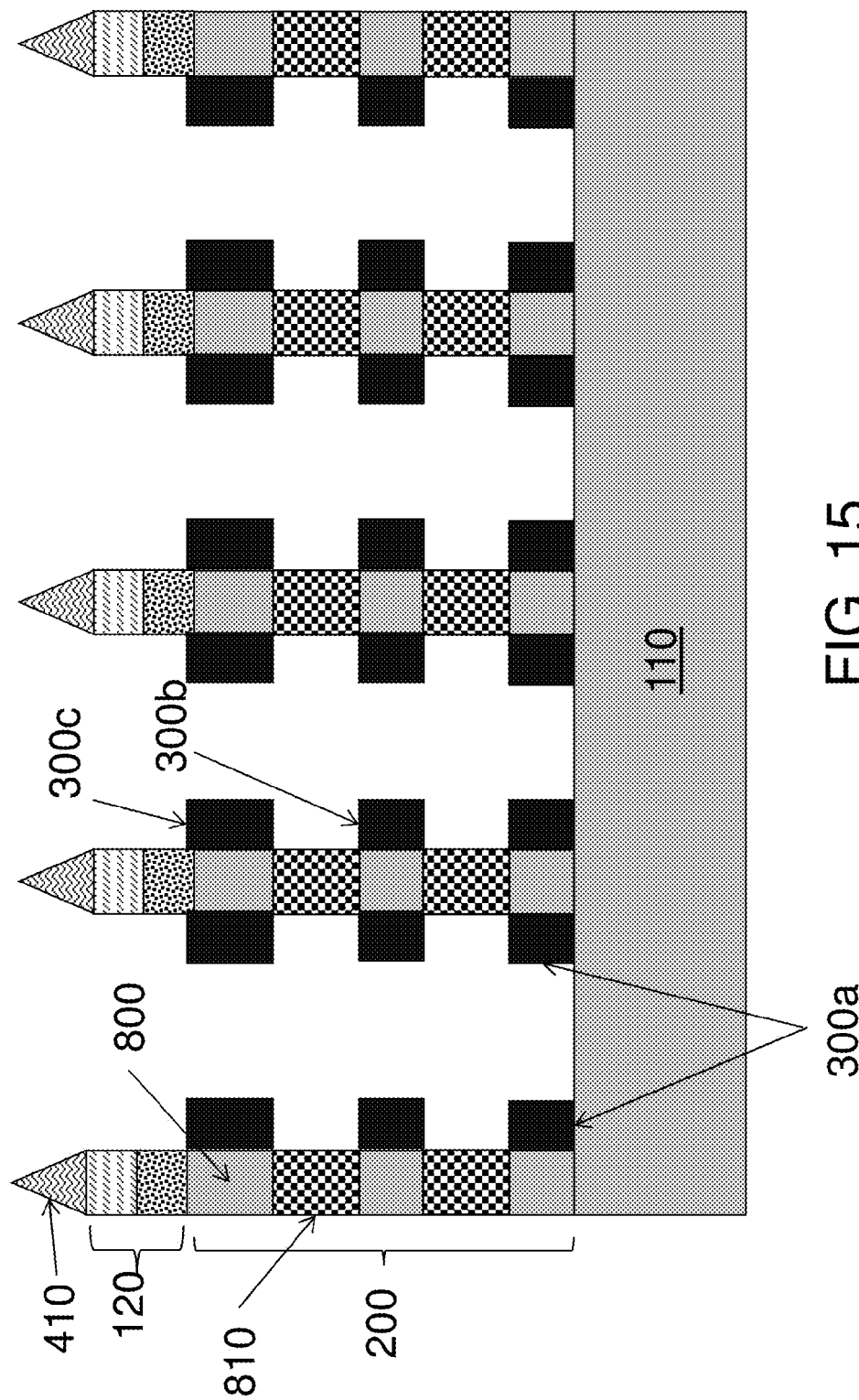
FIG. 15 shows the result of oxidizing the structure shown in FIG. 14.

FIGS. 14 and 15 illustrate the formation of the nanowires 800 according to an alternate embodiment to the one shown with reference to FIGS. 8 through 13. FIG. 14 shows the structure shown in FIG. 7 with the first and second dielectric films 400a, 400b removed. The dielectric films 400a, 400b may be etched via RIE or wet etch in a solution of Hydrogen Fluoride (HF), for example. In the embodiment shown by FIGS. 14 and 15, oxidation follows removal of the dielectric films 400a, 400b. FIG. 15 shows the result of oxidizing the structure shown in FIG. 14. As noted with reference to FIG. 13, the sections of each of the fins 200 that are shielded from the oxidation (by the spacers 300a, 300b, 300c) form the nanowires 800.

Figure 16:
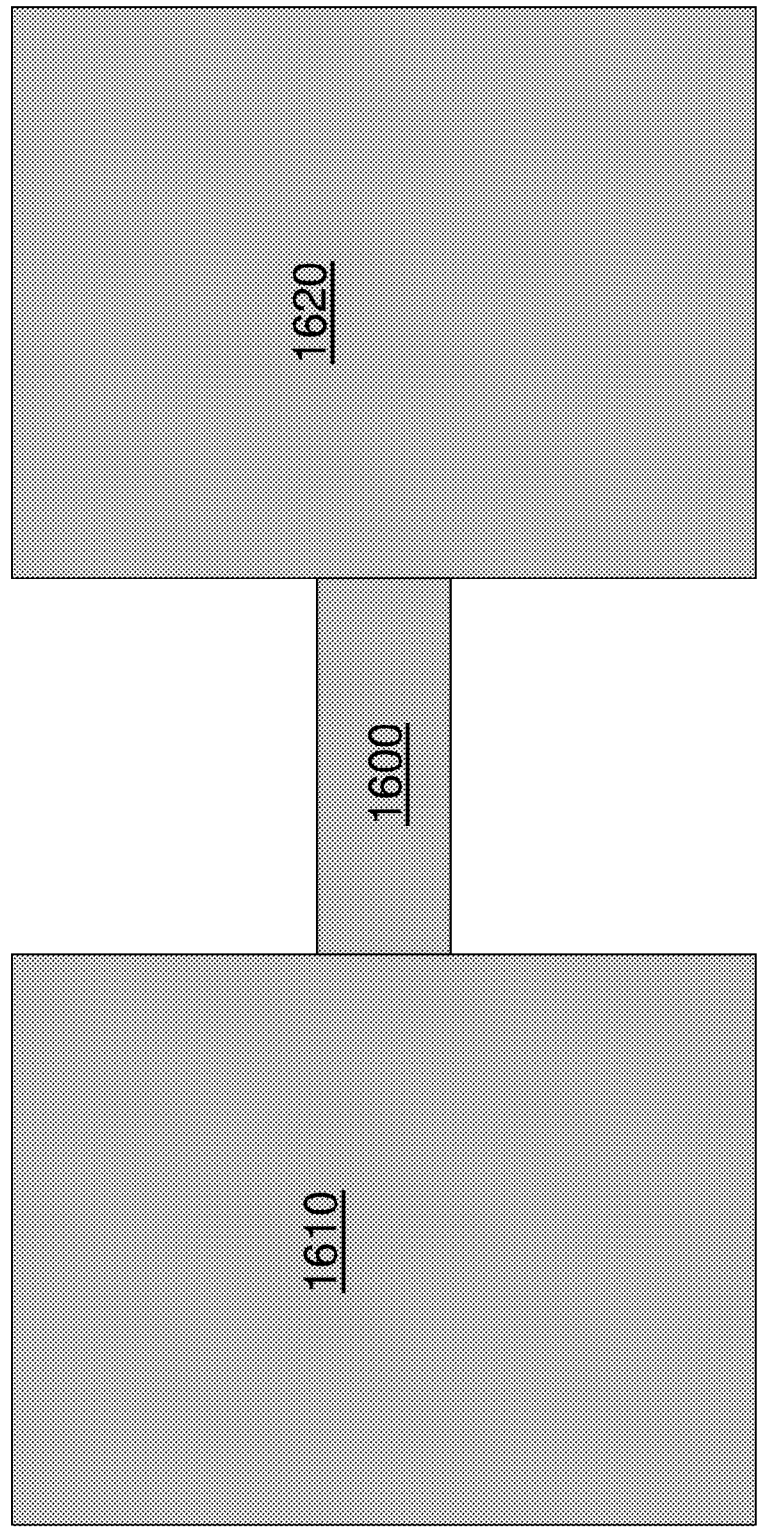
FIG. 16 is a perspective top-down view of a transistor that includes the nanowires.
Figure 17:
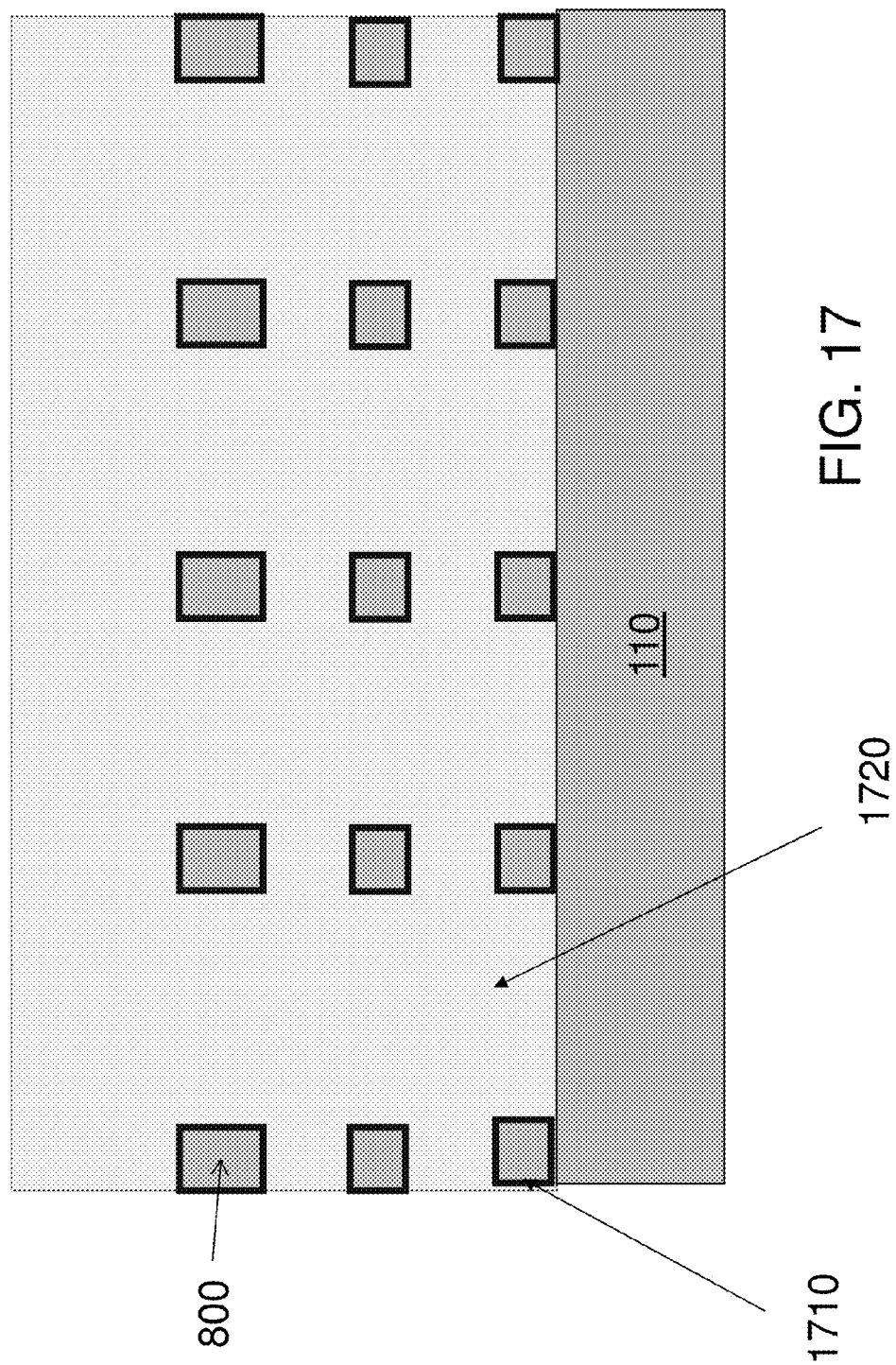
FIG. 17 illustrates the final structure under the transistor gate.

FIG. 16 is a perspective top-down view of a transistor that includes the nanowires 101. The nanowire 101 stack 1600 connects source 1610 and drain 1620 regions. FIG. 17 illustrates the final structure under the transistor gate. The oxide (sections 810) between the nanowires 800 may be removed during the replacement metal gate (RMG) process. The nanowires 800 are each surrounded by a gate dielectric 1710. The gate metal 1720 may be, for example, tantalum (Ta), tantalum nitride (TaN), or niobium (Nb).

Figure 18:
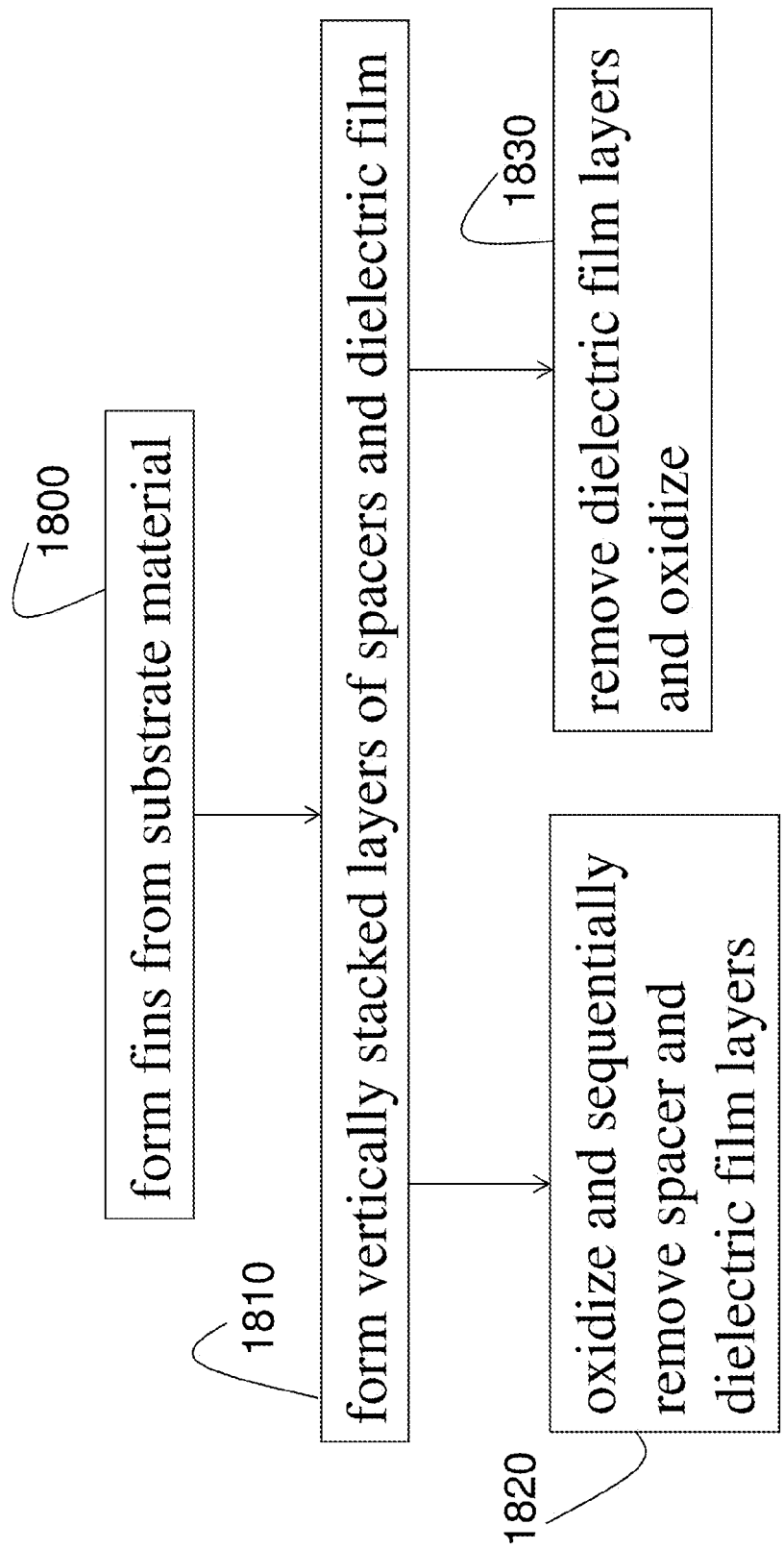
FIG. 18 is a process flow of a method of fabricating nanowires according to embodiments of the invention.

FIG. 18 is a process flow of a method of fabricating nanowires 800 according to embodiments of the invention. At block 1800, forming the fins 200 from the substrate 110 material is through etching as discussed with reference to FIG. 2. Forming the vertically stacked layers of spacers 300a, 300b, 300c and dielectric films 400a, 400b at block 1810 is based on separating the vertically stacked sets of spacers 300a, 300b, 300c using the dielectric films 400a, 400b as shown in FIGS. 3 through 7. According to one embodiment, the method proceeds to block 1820 which includes oxidizing and sequentially removing the spacers 300a, 300b, 300c and dielectric film 400a, 400b layers as shown in FIGS. 8 through 13.

According to another embodiment, the method proceeds to block 1830 which includes removing the dielectric film 400a, 400b layers and oxidizing the resulting structure as shown in FIGS. 14 and 15.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one more other features, integers, steps, operations, element components, and/or groups thereof.

The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated The flow diagrams depicted herein are just one example. There may be many variations to this diagram or the steps (or operations) described therein without departing from the spirit of the invention. For instance, the steps may be performed in a differing order or steps may be added, deleted or modified. All of these variations are considered a part of the claimed invention.

While the preferred embodiment to the invention had been described, it will be understood that those skilled in the art, both now and in the future, may make various improvements and enhancements which fall within the scope of the claims which follow. These claims should be construed to maintain the proper protection for the invention first described.

What is claimed is:

1. A stacked nanowire device, comprising:
   a fin etched from a substrate and formed on the substrate, the fin forming a vertical structure extending above the substrate, the fin including a first nanowire at a first location of the fin and a second nanowire at a second location of the fin, the first location and the second location being different locations at respective first vertical positions on the fin, and the fin also including oxidized portions formed at respective second vertical positions on the fin, different from the first vertical positions; and
   at least two pairs of spacers, a first pair of spacers of the at least two pairs of spacers being arranged on opposite sides of the fin at the first location of the vertical structure of the fin and a second pair of the at least two pairs of spacers being arranged on the opposite sides of the fin at the second location of the vertical structure of the fin.

2. The device according to claim 1, wherein the first location is vertically separated from the second location.

3. The device according to claim 1, wherein the first nanowire and the second nanowire are formed through oxidation of the fin.

4. The device according to claim 1, further comprising a dielectric film formed over the first pair of spacers of the at least two pairs of spacers.

5. The device according to claim 4, wherein the second pair of spacers of the at least two pairs of spacers is formed on the dielectric film.

6. The device according to claim 5, wherein a height of the dielectric film corresponds with a vertical separation between the first location and the second location.

7. The device according to claim 4, wherein the first nanowire and the second nanowires are formed through oxidation of the structure including the dielectric film.

8. The device according to claim 1, further comprising a hard mask formed above the fin.

9. The device according to claim 8, further comprising a high density plasma oxide film structure formed on the hard mask.

* * * * *